(12) United States Patent
Abe et al.

(10) Patent No.: US 10,593,587 B2
(45) Date of Patent: Mar. 17, 2020

(54) SUBSTRATE TREATMENT APPARATUS

(71) Applicant: SCREEN Holdings Co., Ltd., Kyoto (JP)

(72) Inventors: Hiroshi Abe, Kyoto (JP); Toyohide Hayashi, Kyoto (JP); Kenji Kobayashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/080,763

(22) PCT Filed: Feb. 27, 2017

(86) PCT No.: PCT/JP2017/007462
§ 371 (c)(1),
(2) Date: Aug. 29, 2018

(87) PCT Pub. No.: WO2017/169435
PCT Pub. Date: Oct. 5, 2017

(65) Prior Publication Data
US 2019/0096737 A1    Mar. 28, 2019

(30) Foreign Application Priority Data
Mar. 30, 2016 (JP) .................. 2016-067177

(51) Int. Cl.
*H01L 21/687* (2006.01)
*H01L 21/67* (2006.01)
*H01L 21/02* (2006.01)

(52) U.S. Cl.
CPC .. *H01L 21/68764* (2013.01); *H01L 21/02057* (2013.01); *H01L 21/6715* (2013.01);
(Continued)

(58) Field of Classification Search
CPC ................... H01L 21/68764; H01L 21/67051
See application file for complete search history.

(56) References Cited

U.S. PATENT DOCUMENTS

2013/0061873 A1    3/2013 Hohenwarter et al.
2013/0196512 A1    8/2013 Koide et al.
(Continued)

FOREIGN PATENT DOCUMENTS

JP    2008-034553 A    2/2008
JP    2013-157480 A    8/2013
(Continued)

OTHER PUBLICATIONS

International Preliminary Report on Patentability (Chapter I) with a Notification from the International Bureau Form PCT/IB/326 for International Application No. PCT/JP2017/007462 dated Oct. 11, 2018.
(Continued)

*Primary Examiner* — Farun Lu
(74) *Attorney, Agent, or Firm* — Ostrolenk Faber LLP

(57) ABSTRACT

A substrate processing apparatus includes a spin base on which a chuck member that holds a peripheral edge of a substrate is disposed, a motor which rotates the spin base, a heater unit which is positioned between the substrate held by the chuck member and an upper surface of the spin base, a processing liquid supply unit which supplies a processing liquid toward a surface of the substrate held by the chuck member, and a microwave generating unit which generates microwaves to a lower surface of the substrate from the heater unit. The microwave generating unit may include a microwave generating member which includes a waveguide disposed in the heater unit, microwave oscillator which is disposed outside the heater unit and a coaxial cable which connects the waveguide to the microwave oscillator.

16 Claims, 9 Drawing Sheets

(52) U.S. Cl.
CPC .. *H01L 21/67017* (2013.01); *H01L 21/67028* (2013.01); *H01L 21/67051* (2013.01); *H01L 21/67103* (2013.01); *H01L 21/67115* (2013.01); *H01L 21/67248* (2013.01); *H01L 21/68728* (2013.01); *H01L 21/68792* (2013.01)

(56) References Cited

U.S. PATENT DOCUMENTS

| | | | |
|---|---|---|---|
| 2014/0127908 A1 | 5/2014 | Okutani | |
| 2014/0367377 A1 | 12/2014 | Monden et al. | 217/747 |
| 2016/0025409 A1* | 1/2016 | Miyazaki | F26B 3/28 34/274 |
| 2016/0064189 A1 | 3/2016 | Tandou et al. | |
| 2016/0223462 A1 | 8/2016 | Hayashi et al. | |

FOREIGN PATENT DOCUMENTS

| | | |
|---|---|---|
| JP | 2014-112652 A | 6/2014 |
| JP | 2014-528163 A | 10/2014 |
| JP | 2016-9796 | 1/2016 |
| KR | 10-0757717 | 11/2001 |
| TW | 201526713 A | 7/2015 |
| TW | 201530126 A | 8/2015 |
| TW | 201608599 A | 3/2016 |
| WO | WO 2013/035020 A1 | 3/2013 |
| WO | WO 2014/136670 A1 | 9/2014 |

OTHER PUBLICATIONS

English translation of the International Preliminary Report on Patentability (Chapter 1) with a Notification from the International Bureau Form PCT/IB/338 International Application No. PCT/JP2017/007462 dated Oct. 11, 2018.

International Search Report dated May 9, 2017 in corresponding PCT International Application No. PCT/JP2017/007462.

Written Opinion dated May 9, 2017 in corresponding PCT International Application No. PCT/JP2017/007462.

* cited by examiner

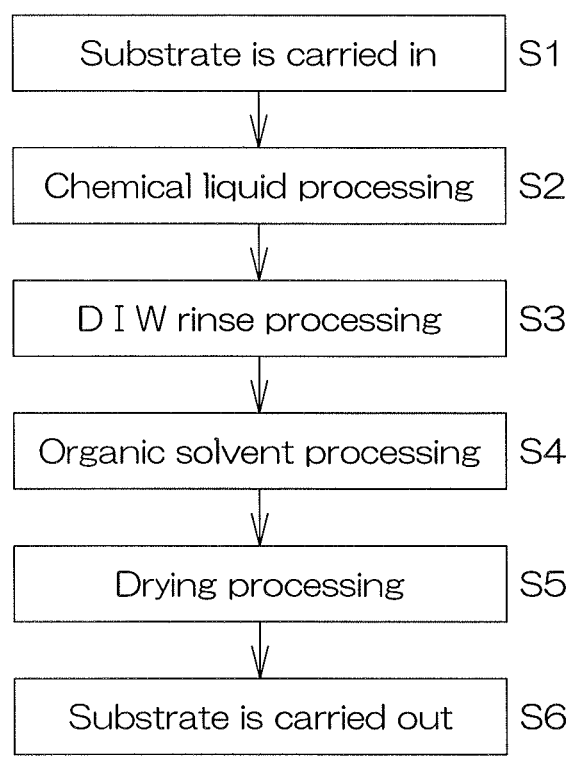

SUBSTRATE TREATMENT APPARATUS

CROSS-REFERENCE TO RELATED APPLICATIONS

The present application is a 35 U.S.C. §§ 371 national phase conversion of PCT/JP2017/007462, filed Feb. 27, 2017, which claims priority to Japanese Patent Application No. 2016-067177, filed Mar. 30, 2016, the contents of both of which are incorporated herein by reference. The PCT International Application was published in the Japanese language.

FIELD OF THE INVENTION

The present invention relates to a substrate processing apparatus which processes a substrate by using a processing liquid. Substrates to be processed by the substrate processing apparatus include, for example, semiconductor substrates, substrates for liquid crystal displays, substrates for plasma displays, substrates for FEDs (Field Emission Displays), substrates for optical disks, substrates for magnetic disks, substrates for magneto-optical disks and substrates for photomasks.

DESCRIPTION OF RELATED ARTS

In a manufacturing process for semiconductor apparatuses or liquid crystal displays, substrate processing apparatuses arranged to process substrates such as semiconductor wafers by using a processing liquid is used. A single substrate processing type substrate processing apparatus that processes a substrate one at a time includes, for example, a spin chuck that rotates the substrate while holding the substrate horizontally, and a processing liquid supply portion which discharges a processing liquid toward the substrate held by the spin chuck.

In the single substrate processing type substrate processing apparatus, in a state that a substrate is horizontally held, a processing liquid is supplied toward an upper surface, a lower surface or an end surface (hereinafter, it may be collectively referred to as a "surface" of the substrate whenever necessary) of the substrate, thereby executing substrate processing. There is known such technology that a substrate is heated to activate a processing liquid attached to the substrate, thereby enhancing a processing efficiency. There is also known such technology that a substrate is heated to enhance a drying efficiency of the substrate (refer to Patent Document 1, Patent Document 2 and Patent Document 3)

PRIOR ART DOCUMENTS

Patent Documents

Patent Document 1: Japanese Patent Application Publication No. 2014-112652

Patent Document 2: Japanese Patent Application Publication No. 2013-157480

Patent Document 3: Japanese Patent Application Publication No. 2014-528163

Patent Document 4: Japanese Patent Application Publication No. 2008-034553

SUMMARY OF THE INVENTION

Technical Problem

A substrate processing apparatus of Patent Document 3 is provided with an infrared heater which heats from below a substrate held by a substrate holding means. The surface temperature of the infrared heater becomes high when the substrate is heated. Therefore, if a processing liquid drops on the infrared heater from the substrate when the substrate is heated, the dropped processing liquid is heated on the surface of the infrared heater and turned into mist, resulting in possible contamination of the atmosphere.

Thus, an object of the present invention is to provide a substrate processing apparatus which is capable of suppressing or preventing a processing liquid from being turned into mist when being dropped on a heater unit from a substrate.

Solution to the Problems

The present invention provides a substrate processing apparatus which includes a spin base on which a chuck member that holds a peripheral edge of a substrate is disposed, a motor which rotates the spin base, a heater unit which is positioned between the substrate held by the chuck member and an upper surface of the spin base, a processing liquid supply means which supplies a processing liquid toward a surface of the substrate held by the chuck member, and a microwave generating unit which generates microwaves toward a lower surface of the substrate from the heater unit.

The substrate processing apparatus supplies a processing liquid toward the surface of the substrate from the processing liquid supply means, thereby executing substrate processing. Further, the substrate can be heated from below by microwaves generated from the heater unit positioned below the substrate.

Since the substrate is heated by microwaves, the temperature of the heater unit itself does not become so hot. Therefore, even if a processing liquid supplied from the processing liquid supply unit may drop on the heater unit, it is possible to suppress or prevent the processing liquid from being evaporated by the heater unit and being turned into mist.

In a preferred embodiment of the present invention, the microwave generating unit includes a microwave generating member which includes a waveguide disposed in the heater unit, a microwave oscillator which is disposed outside the heater unit, and a coaxial cable which connects the waveguide to the microwave oscillator.

According to the above-described configuration, the microwave oscillator is disposed outside the heater unit and, therefore, the heater unit can be made compact in size.

In a preferred embodiment of the present invention, an upper surface of the waveguide is protected by a protective member.

According to the above-described configuration, the waveguide can be protected by the protective member.

In a preferred embodiment of the present invention, the processing liquid is an organic solvent which is supplied to an upper surface of a substrate, and the heater unit heats the substrate when the substrate is processed by the organic solvent.

According to the above-described configuration, the substrate is heated when the substrate is processed by the organic solvent, thus making it possible to accelerate processing of the substrate.

In a preferred embodiment of the present invention, the processing liquid supply means forms a liquid film of the organic solvent on an upper surface of the substrate, and the heater unit heats a lower surface of the substrate at least when the liquid film of the organic solvent has been formed. Thereby, a gas film layer is formed between the liquid film of the organic solvent and the upper surface of the substrate to float the liquid film of the organic solvent from the upper surface of the substrate.

According to the above-described configuration, the heater unit heats the lower surface of the substrate. It is, therefore, possible to form a gas phase layer between the liquid film of the organic solvent formed on the upper surface of the substrate and the upper surface of the substrate.

The above and other objects, features and effects of the present invention will become more apparent from the following detailed description of the present preferred embodiments with reference to the accompanying drawings.

BRIEF DESCRIPTION OF THE DRAWINGS

FIG. 5A shows a closed state and FIG. 5B shows an open state.

FIG. 7 is a flowchart which illustrates one example of substrate processing by the substrate processing apparatus.

DETAILED DESCRIPTION OF THE PREFERRED EMBODIMENTS

Figure 1:
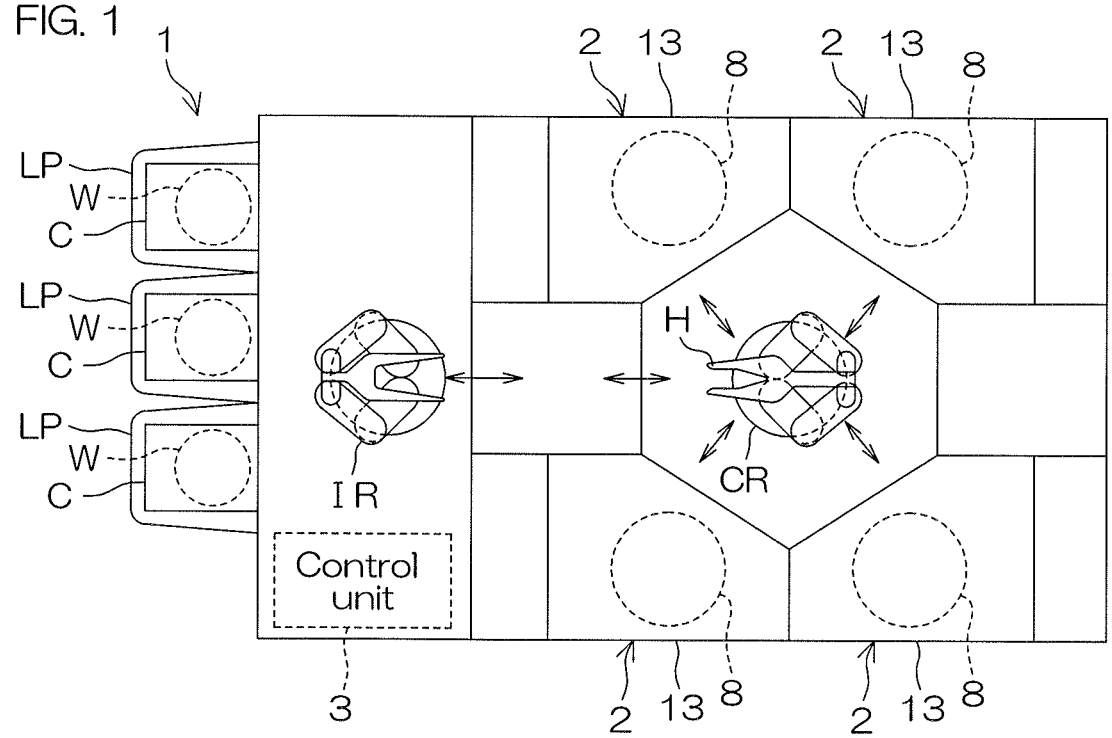
FIG. 1 is an illustrative plan view which illustrates a layout inside a substrate processing apparatus according to a preferred embodiment of the present invention.

FIG. 1 is an illustrative plan view which illustrates a layout inside a substrate processing apparatus according to a preferred embodiment of the present invention. A substrate processing apparatus 1 is a single substrate processing type apparatus which processes a substrate W such as a silicon wafer one by one. In the present preferred embodiment, the substrate W is a disk-shaped substrate. The substrate processing apparatus 1 includes a plurality of processing units 2 which process a substrate W by using a processing liquid, a load port LP at which a carrier C for housing a plurality of substrates W to be processed by the processing units 2 is placed, transfer robots IR and CR which transfer a substrate W between the load port LP and the processing unit 2, and a control unit 3 which controls the substrate processing apparatus 1. The transfer robot IR transfers a substrate W between the carrier C and the transfer robot CR. The transfer robot CR transfers a substrate W between the transfer robot IR and the processing unit 2. The plurality of processing units 2 are similar in constitution to each other.

Figure 2:
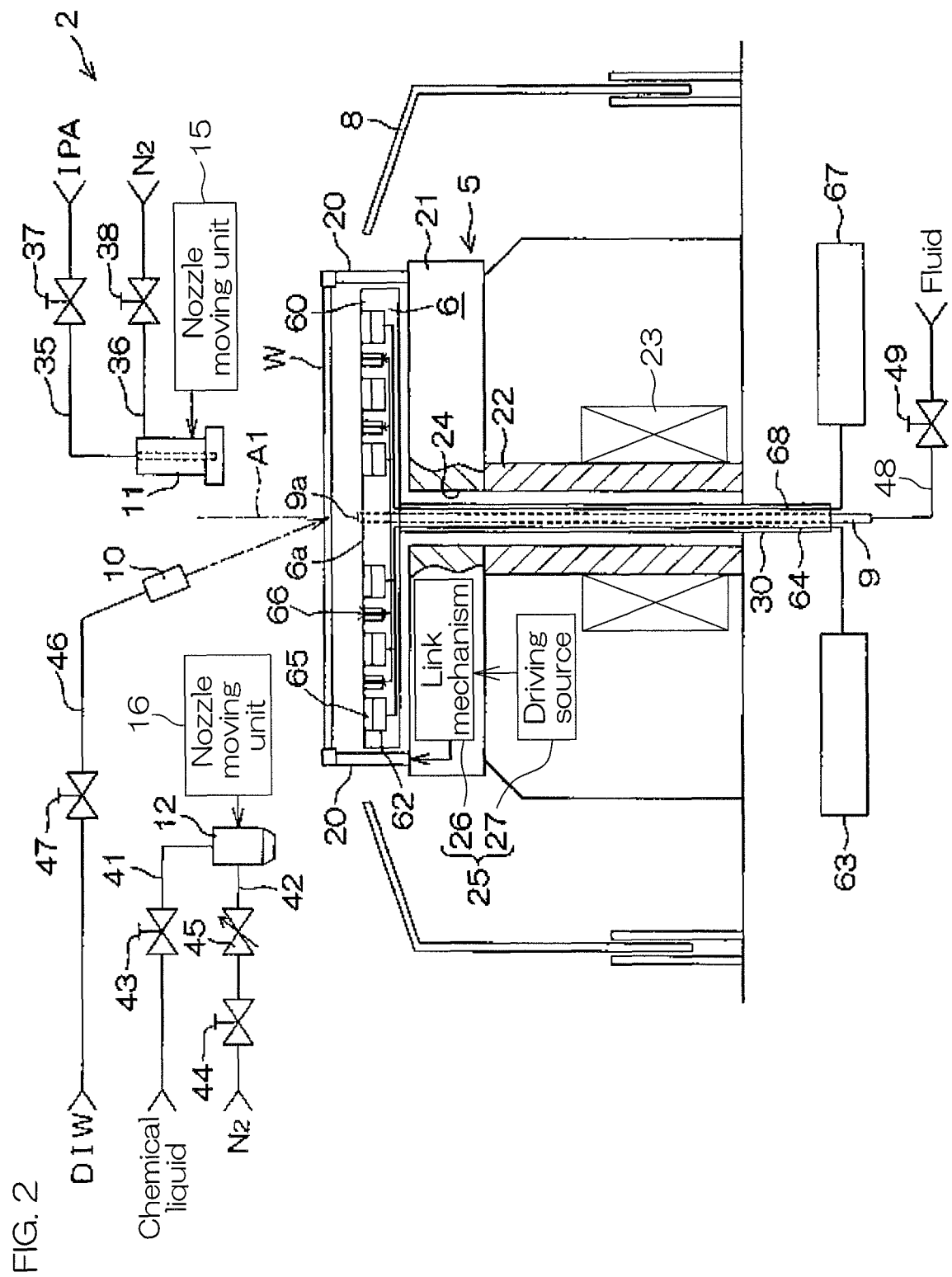
FIG. 2 is an illustrative sectional view which illustrates a configuration example of a processing unit disposed in the substrate processing apparatus.

FIG. 2 is an illustrative sectional view which illustrates a configuration example of the processing unit 2. The processing unit 2 includes a spin chuck 5 which holds a single substrate W in a horizontal posture and rotates the substrate W around a vertical rotation axis A1 which passes through a central portion of the substrate W, a heater unit 6 which heats the substrate W from the lower surface side, a tubular cup 8 which surrounds the spin chuck 5, a lower surface nozzle 9 which supplies a processing fluid to a lower surface of the substrate W, a DIW nozzle 10 which supplies deionized water (DIW) as a rinse liquid to an upper surface of the substrate W, a first moving nozzle 11 which can move above the substrate W, and a second moving nozzle 12 which can move above the substrate W. The processing unit 2 also includes a chamber 13 (refer to FIG. 1) which houses the cup 8. Although not shown in the drawing, the chamber 13 has formed therein a carry-in/carry-out port for carrying in and carrying out the substrate W and includes a shutter unit that opens and closes the carry-in/carry-out port.

The spin chuck 5 includes a chuck pin 20, a spin base 21, a rotating shaft 22 which is coupled to a lower surface center of the spin base 21, and an electric motor 23 which applies a rotational force to the rotating shaft 22. The rotating shaft 22 extends in a vertical direction along the rotation axis A1 and is a hollow shaft in the present preferred embodiment. The spin base 21 is coupled to an upper end of the rotating shaft 22. The spin base 21 has a disk shape along a horizontal direction. The plurality of chuck pins 20 are disposed at intervals in a circumferential direction at a peripheral edge portion of an upper surface of the spin base 21. The plurality of chuck pins 20 are capable of being opened and closed between a closed state of contacting a peripheral end of a substrate W and gripping (holding) the substrate W and an open state of being retracted from the peripheral end of the substrate W. In the open state, the plurality of chuck pins 20 contact a lower surface of a peripheral edge portion of the substrate W and can thereby support the substrate W from below.

A chuck pin driving unit 25 is included to drive the chuck pins 20 so as to open and close the chuck pins 20. The chuck pin driving unit 25 includes, for example, a link mechanism 26 incorporated in the spin base 21 and a driving source 27 disposed outside the spin base 21. The driving source 27 includes, for example, a ball screw mechanism and an electric motor that applies a driving force thereto. A specific configuration example of the chuck pin driving unit 25 is described in Patent Document 4, etc.

The heater unit 6 is disposed between the upper side of the spin base 21 and a substrate W held by the chuck pin 20. A support shaft 30 which extends in a vertical direction along the rotation axis A1 is coupled to a lower surface of the heater unit 6. The support shaft 30 is inserted through a through hole 24 formed at a central portion of the spin base 21 and the hollow rotating shaft 22. A lower end of the support shaft 30 extends further downward from the lower end of the rotating shaft 22.

The heater unit 6 includes a disk-shaped (plate-shaped) heater main body 60. A plurality of waveguides 62 (microwave generating members) are disposed at the heater main body 60 in an embedded state. Further, a microwave oscillator 63 is disposed below the support shaft 30. Each of the waveguides 62 is connected to the microwave oscillator 63 by a coaxial cable 64 which is inserted through the support shaft 30. The waveguide 62 is able to irradiate microwaves supplied from the microwave oscillator 63 via the coaxial cable 64 to a lower surface of a substrate W held by the chuck pin 20 and heat the lower surface thereof. Unlike infrared heaters and the like, the waveguide 62 does not rise to a high temperature during actuation. Therefore, even if a processing liquid (a rinse liquid or a chemical liquid to be described later) drops from the substrate W to the heater unit 6, the processing liquid can be suppressed or prevented from being heated on the surface of the heater unit 6 and being turned into mist. Thus, the atmosphere inside the cup 8 can be suppressed or prevented from being contaminated by the processing liquid which has been turned into mist.

An upper surface of each of the waveguides 62 is covered with a protective member 65. An upper surface of the protective member 65 is positioned at a height equal to that of an upper surface 60a of the heater main body 60. The protective member 65 is constituted with a microwave permeable material. Therefore, microwaves irradiated from the waveguide 62 can satisfactorily pass through the protective member 65. It is desirable that the protective member 65 is resistant to chemicals. The protective member 65 may be composed, for example, of PTE (polytetrafluoroethylene).

A light source 66 is disposed in an embedded state between the plurality of waveguides 62. The light source 66 can irradiate visible light and near-infrared light to a lower surface of a substrate W held by the chuck pin 20. The light source 66 is used for lowering the resistivity of a substrate W by photoelectric effects. Details thereof will be described later. A power source 67 is disposed below the support shaft 30. Each of the light sources 66 is connected to the power source 67 by a power cable 68 which is inserted through the support shaft 30. Each of the light sources 66 emits light when electric power is supplied from the power cable 68.

The upper surface 60a of the heater main body 60 is disposed by being separated from a lower surface of a substrate W to such an extent that microwaves from the waveguide 62 are not attenuated. In order to prevent contamination of the lower surface of the substrate W, the upper surface 60a of the heater main body 60 is desirably disposed at such a height that is not directly in contact with the lower surface of the substrate W.

The first moving nozzle 11 (processing liquid supply means) is moved by a first nozzle moving unit 15 in a horizontal direction and in a vertical direction. The first moving nozzle 11 can be moved, by movement in the horizontal direction, between a processing position of facing a rotation center of an upper surface of the substrate W and a home position (retracted position) of not facing the upper surface of the substrate W. The rotation center of the upper surface of the substrate W is a position of the upper surface of the substrate W that intersects the rotation axis A1. The home position of not facing the upper surface of the substrate W is a position which, in a plan view, is at the outer side of the spin base 21 and, more specifically, may be a position at the outer side of the cup 8. By movement in the vertical direction, the first moving nozzle 11 can be brought close to the upper surface of the substrate W or can be retracted upward from the upper surface of the substrate W. The first nozzle moving unit 15 includes, for example, a pivoting shaft extending along the vertical direction, an arm coupled to the pivoting shaft and extending horizontally and an arm driving mechanism which drives the arm. The arm driving mechanism swings the arm by making the pivoting shaft pivot around a vertical pivoting axis, and moves the arm up and down by raising and lowering the pivoting shaft along the vertical direction. The first moving nozzle 11 is fixed to the arm. The first moving nozzle 11 moves in the horizontal direction and in a vertical direction in accordance with swinging and raising/lowering of the arm.

The second moving nozzle 12 (processing liquid supply means) is moved in the horizontal direction and in the perpendicular direction by a second nozzle moving unit 16. The second moving nozzle 12 can be moved, by movement in the horizontal direction, between a position of facing the rotation center of the upper surface of the substrate W and a home position (retracted position) of not facing the upper surface of the substrate W. The home position is a position which, in a plan view, is at the outer side of the spin base 21 and, more specifically, may be a position at the outer side of the cup 8. By movement in the vertical direction, the second moving nozzle 12 can be brought close to the upper surface of the substrate W or retracted upward from the upper surface of the substrate W. The second nozzle moving unit 16 includes, for example, a pivoting shaft extending along the vertical direction, an arm coupled to the pivoting shaft and extending horizontally, and an arm driving mechanism which drives the arm. The arm driving mechanism swings the arm by making the pivoting shaft pivot around a vertical pivoting axis, and moves the arm up and down by raising and lowering the pivoting shaft along the vertical direction. The second moving nozzle 12 is fixed to the arm. The second moving nozzle 12 moves in the horizontal direction and in the vertical direction in accordance with swinging and raising/lowering of the arm.

In the present preferred embodiment, the first moving nozzle 11 has a function of an organic solvent nozzle that discharges an organic solvent and a function of a gas nozzle that discharges an inert gas such as nitrogen gas, etc. An organic solvent supply pipe 35 and an inert gas supply pipe 36 are coupled to the first moving nozzle 11. The organic solvent supply pipe 35 interposes therein an organic solvent valve 37 that opens and closes a flow passage thereof. The inert gas supply pipe 36 interposes therein an inert gas valve 38 that opens and closes a flow passage thereof. An organic solvent such as isopropyl alcohol (IPA), etc., is supplied to the organic solvent supply pipe 35 from an organic solvent supply source. An inert gas such as nitrogen gas ($N_2$), etc., is supplied to the inert gas supply pipe 36 from an inert gas supply source.

In the present preferred embodiment, the second moving nozzle 12 has a function of a chemical liquid nozzle that supplies a chemical liquid such as an acid and alkali, etc., and a function of a gas nozzle that discharges an inert gas such as nitrogen gas, etc. More specifically, the second moving nozzle 12 may have a form of a double fluid nozzle capable of mixing and discharging a liquid and a gas. The double fluid nozzle may be used as a liquid nozzle when it is made to discharge a liquid, with the supply of a gas being stopped, and may be used as a gas nozzle when it is made to discharge a gas, with the supply of a liquid being stopped. A chemical liquid supply pipe 41 and an inert gas supply pipe 42 are coupled to the second moving nozzle 12. The chemical liquid supply pipe 41 interposes therein a chemical liquid valve 43 that opens and closes a flow passage thereof. The inert gas supply pipe 42 has interposes therein an inert gas valve 44 that opens and closes a flow passage thereof and a variable flow valve 45 that adjusts a flow rate of an inert gas. A chemical liquid such as an acid and alkali, etc., is supplied to the chemical liquid supply pipe 41 from a chemical liquid supply source. An inert gas such as nitrogen gas ($N_2$), etc., is supplied to the inert gas supply pipe 42 from an inert gas supply source.

Specifically, a chemical liquid includes etching liquid and a cleaning liquid are examples of the chemical liquid. More specifically, the chemical liquid may be hydrofluoric acid, SC1 (ammonia-hydrogen peroxide mixture), SC2 (hydrochloric acid-hydrogen peroxide mixture), buffered hydrofluoric acid (mixed liquid of hydrofluoric acid and ammonia fluoride) and SPM (mixed liquid of sulfuric acid and hydrogen peroxide).

In the present preferred embodiment, the DIW nozzle 10 is a fixed nozzle which is disposed to discharge DIW toward the rotation center of the upper surface of the substrate W. DIW is supplied to the DIW nozzle 10 from a DIW supply source via a DIW supply pipe 46. The DIW supply pipe 46 interposes therein a DIW valve 47 that opens and closes a flow passage thereof. The DIW nozzle 10 is not necessarily required to be a fixed nozzle and may be a moving nozzle that moves at least in the horizontal direction.

The lower surface nozzle 9 (processing liquid supply means) is inserted through the hollow support shaft 30 and also penetrates through the heater unit 6. The lower surface nozzle 9 has at its upper end a discharge port 9a that faces a lower surface center of the substrate W. A processing fluid is supplied to the lower surface nozzle 9 via a fluid supply pipe 48 from a fluid supply source. The processing fluid that is supplied may be a liquid or may be a gas. The fluid supply pipe 48 interposes therein a fluid valve 49 that opens and closes a flow passage thereof.

Figure 3:
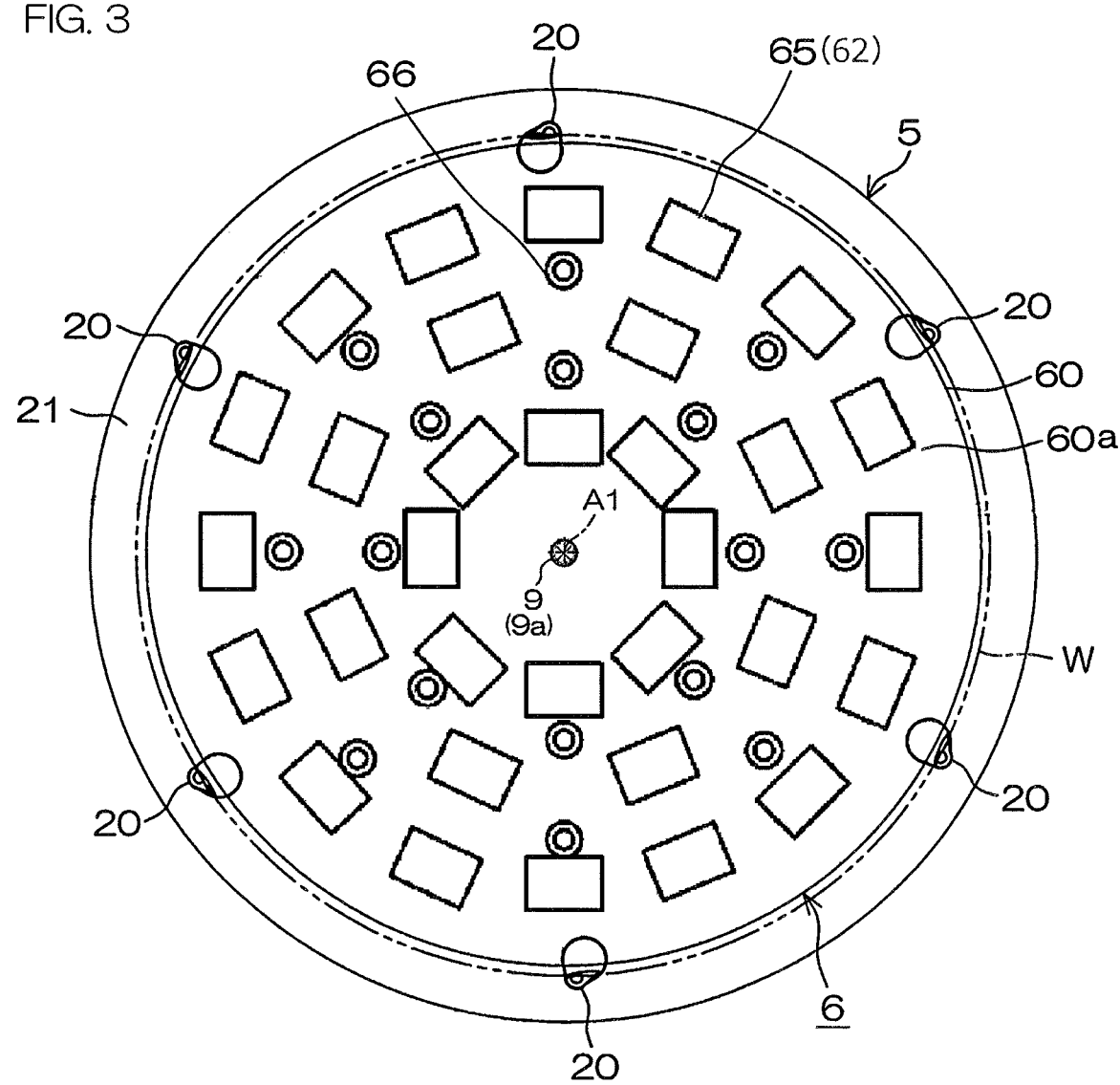
FIG. 3 is a plan view of a spin chuck and a heater unit which are disposed in the processing unit.

FIG. 3 is a plan view of the spin chuck 5 and the heater unit 6. The spin base 21 of the spin chuck 5 is, in a plan view, a circle centered around the rotation axis A1, and a diameter thereof is larger than a diameter of the substrate W. A plurality (six in the present preferred embodiment) of chuck pins 20 are disposed at intervals at the peripheral edge portion of the spin base 21.

The heater unit 6 is formed in a disk shape. As described previously, the heater unit 6 includes the heater main body 60, the waveguide 62, the protective member 65 and the light source 66. The heater main body 60 has, in a plan view, substantially the same shape and size as the outer shape of the substrate W and is constituted as a circle centered around the rotation axis A1. More accurately, the heater main body 60 has a circular planar shape with a diameter slightly smaller than the diameter of the substrate W. For example, the diameter of the substrate W may be 300 mm and the diameter of the heater main body 60 (in particular, a diameter of the upper surface 60a of the heater main body 60) may be smaller by 6 mm, that is, 294 mm. In this case, a radius of the heater main body 60 is smaller by 3 mm than a radius of the substrate W.

An upper surface 60a of the heater main body 60 is a flat surface oriented along a horizontal plane. It is, therefore, possible to keep constant a distance between the upper surface 60a of the heater main body 60 and a substrate W horizontally held by the chuck pin 20. Thereby, the substrate W can be heated efficiently and uniformly.

The plurality of waveguides 62 are concentrically arrayed in the heater main body 60. Each of the waveguides 62 has a rectangular opening. With regard to the plurality of waveguides 62, it is desirable that the number of the plurality of waveguides 62 and intervals thereof in the heater main body 60 as well as a distance between the upper surface 60a of the heater main body and a substrate W are set so that microwaves irradiated from each of the waveguides 62 can overlap each other on the lower surface of the substrate W and the lower surface of the substrate W in its entirety can also be uniformly irradiated with microwaves.

The plurality of light sources 66 are arrayed in the heater main body 60 so that they can be positioned individually between the plurality of waveguides 62.

Figure 4:
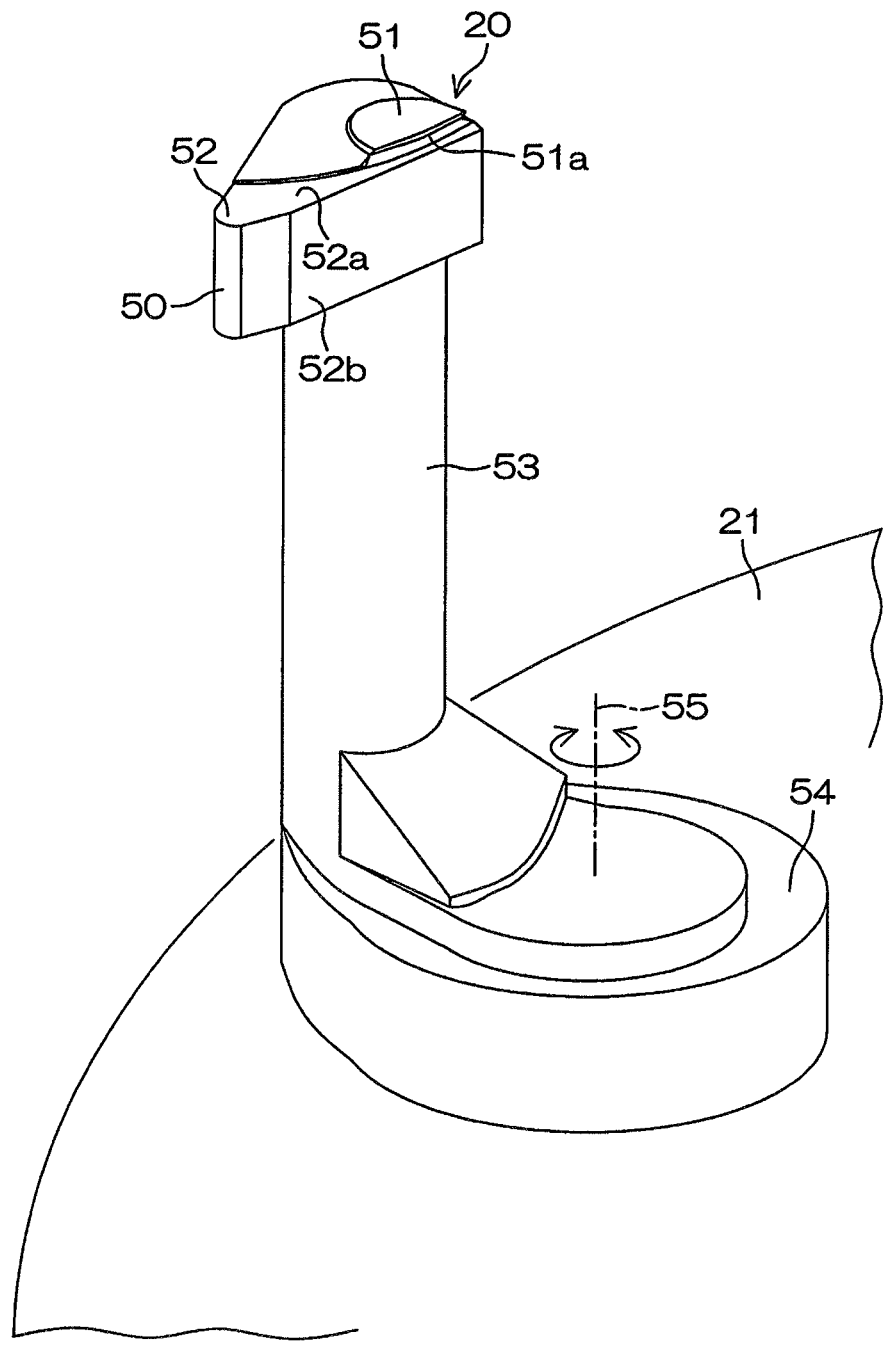
FIG. 4 is a perspective view which illustrates a structure example of a chuck pin disposed on the spin chuck.
Figure 5A:
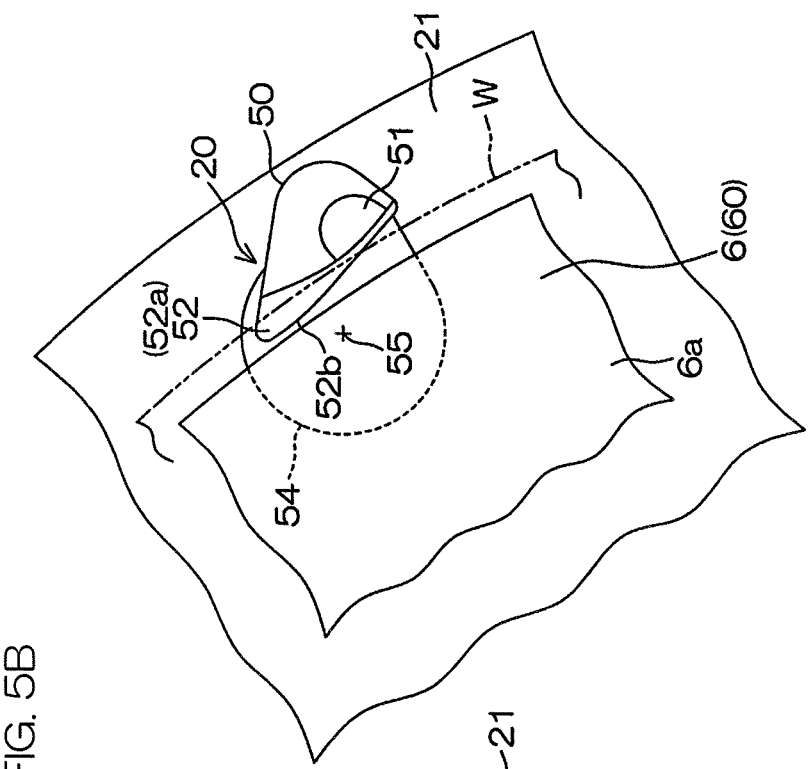
FIG. 5A and FIG. 5B are each a plan view of the chuck pin.
Figure 5B:
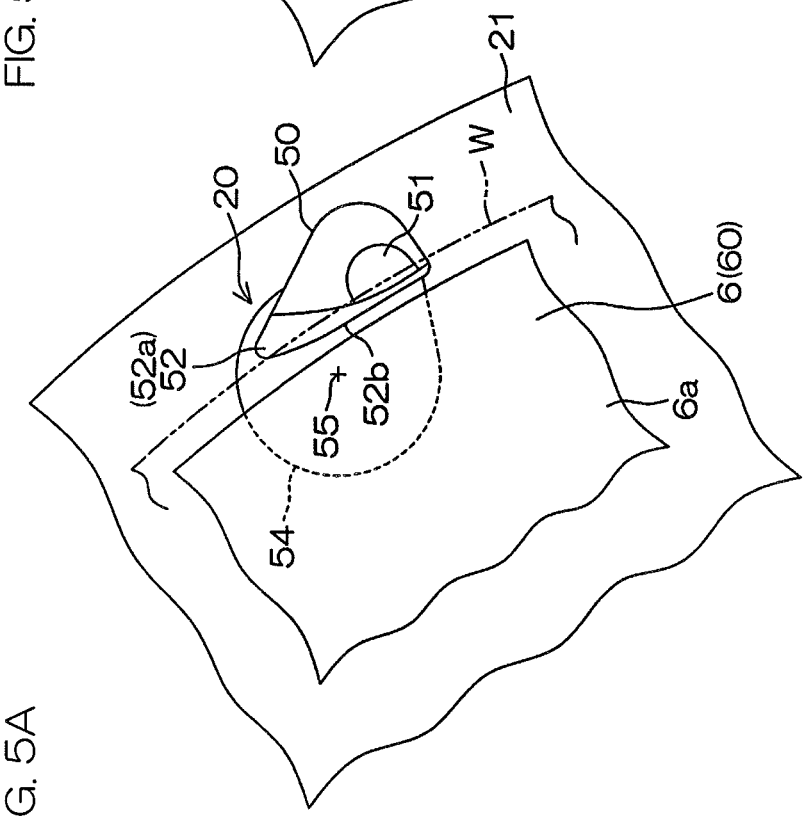

FIG. 4 is a perspective view which illustrates a structure example of the chuck pin 20. Further, FIG. 5A and FIG. 5B are each a plan view of the chuck pin 20. FIG. 5A shows a closed state and FIG. 5B shows an open state.

The chuck pin 20 includes a shaft portion 53 extending in the vertical direction, a base portion 50 disposed at an upper end of the shaft portion 53 and a pivoting supporting portion 54 disposed at a lower end of the shaft portion 53. The base portion 50 includes a gripping portion 51 and a supporting portion 52. The pivoting supporting portion 54 is coupled to the spin base 21 so as to enable pivoting around a chuck pivoting axis 55 extending along the vertical direction. The shaft portion 53 is coupled to the pivoting supporting portion 54, while being offset at a position separated from the chuck pivoting axis 55. More specifically, the shaft portion 53 is disposed at a position further separated from the rotation axis A1 than the chuck pivoting axis 55. Therefore, when the chuck pin 20 is pivoted around the chuck pivoting axis 55, the base portion 50 pivots around the chuck pivoting axis 55, while its entirety moves along a peripheral end surface of the substrate W. The pivoting supporting portion 54 is coupled to the link mechanism 26 (refer to FIG. 2) disposed in the interior of the spin base 21. By a driving force from the link mechanism 26, the pivoting supporting portion 54 is pivoted reciprocally within a predetermined angular range around the chuck pivoting axis 55.

The base portion 50 is formed in a wedge shape in a plan view. A supporting surface 52a, which contacts a peripheral edge portion lower surface of the substrate W when the chuck pin 20 is in the open state to support the substrate W from below, is disposed on an upper surface of the base portion 50. In other words, the base portion 50 has the supporting portion 52 which has the supporting surface 52a as an upper surface. The gripping portion 51 projects upward at a position separate from the supporting portion 52 on the upper surface of the base portion 50. The gripping portion 51 has a holding groove 51a which is opened in a V-shape so as to face the peripheral end surface of the substrate W.

When the pivoting supporting portion 54 is pivoted in a clockwise direction around the chuck pivoting axis 55 from the open state shown in FIG. 5B, the gripping portion 51 moves close to the peripheral end surface of the substrate W, and the supporting portion 52 moves away from the rotation center of the substrate W. Also, when the pivoting supporting portion 54 is pivoted in a counter-clockwise direction around the chuck pivoting axis 55 from the closed state shown in FIG. 5A, the gripping portion 51 moves away from the peripheral end surface of the substrate W, and the supporting portion 52 moves toward the rotation center of the substrate W.

In the closed state of the chuck pin 20 shown in FIG. 5A, the peripheral end surface of the substrate W enters into the holding groove 51a. At this time, the lower surface of the substrate W is positioned at a height separated upward by a minute distance from the supporting surface 52a. In the open state of the chuck pin 20 shown in FIG. 5B, the peripheral end surface of the substrate W is outside the holding groove 51a, and, in a plan view, the gripping portion 51 is positioned further to the outer side than the peripheral end surface of the substrate W. In both the open state and the closed state of the chuck pin 20, the supporting surface 52a is at least partially positioned below the peripheral edge portion lower surface of the substrate W.

When the chuck pin 20 is in the open state, the substrate W can be supported by the supporting portion 52. When the chuck pin 20 is switched from the open state to the closed state, the peripheral end surface of the substrate W is guided into the holding groove 51a of a V-shaped cross section, while being guided by and rising against the holding groove 51a, thereby developing into a state that the substrate W is held between the upper and lower inclined surfaces of the holding groove 51a. When the chuck pin 20 is switched from this state to the open state, the peripheral end surface of the substrate W is slipped downward while being guided by the lower inclined surface of the holding groove 51a, and the peripheral edge portion lower surface of the substrate W contacts the supporting surface 52a.

As shown in FIG. 5A and FIG. 5B, an edge portion of the base portion 50 which faces the heater main body 60 of the heater unit 6, in a plan view, follows the shape of the peripheral edge of the heater main body 60. That is, the supporting portion 52 has a side surface 52b which is, in a plan view, positioned further to the outer side than the heater main body 60 with respect to the rotation center. Thereby, the heater main body 60 which has a heating surface 6a of a circular shape slightly smaller than the substrate W does not interfere with the chuck pins 20 when the heater unit 6 moves up and down. This non-interfering positional relationship is maintained in both the closed state and the open state of the chuck pins 20. That is, in both the closed state and the open state of the chuck pins 20, the side surface 52b of the supporting portion 52 is, in a plan view, separated to the outer side from the upper surface 60a of the heater main body 60 of the heater unit 6.

The diameter of the substrate W is, for example, 300 mm, and the diameter of the upper surface of the heater main body 60 is, for example, 294 mm. Therefore, the upper surface 60a of the heater main body 60 faces substantially the entirety of the lower surface of the substrate W including a central region and a peripheral edge region. In both the closed state and the open state of the chuck pin 20, the supporting portions 52 are disposed in a state of securing an interval not less than a minute predetermined interval (for example, 2 mm) outside the outer peripheral edge of the upper surface 60a.

The gripping portion 51 is constituted so that, in the closed state of the chuck pin 20, an inner edge thereof is positioned in a state of securing an interval not less than a predetermined minute interval (for example, 2 mm) outside the outer peripheral edge of the heater main body 60. Therefore, the heater unit 6 is able to raise or lower the heating surface 6a at the inner side of the gripping portion 51 in both the closed state and the open state of the chuck pin 20 and raise the heating surface 6a until it contacts the lower surface of the substrate W.

The chuck pivoting axis 55 is, in a plan view, positioned on a circumference centered around the rotation axis A1 (refer to FIG. 2 and FIG. 3) and having a smaller radius than the radius of the heating surface 6a.

Figure 6:
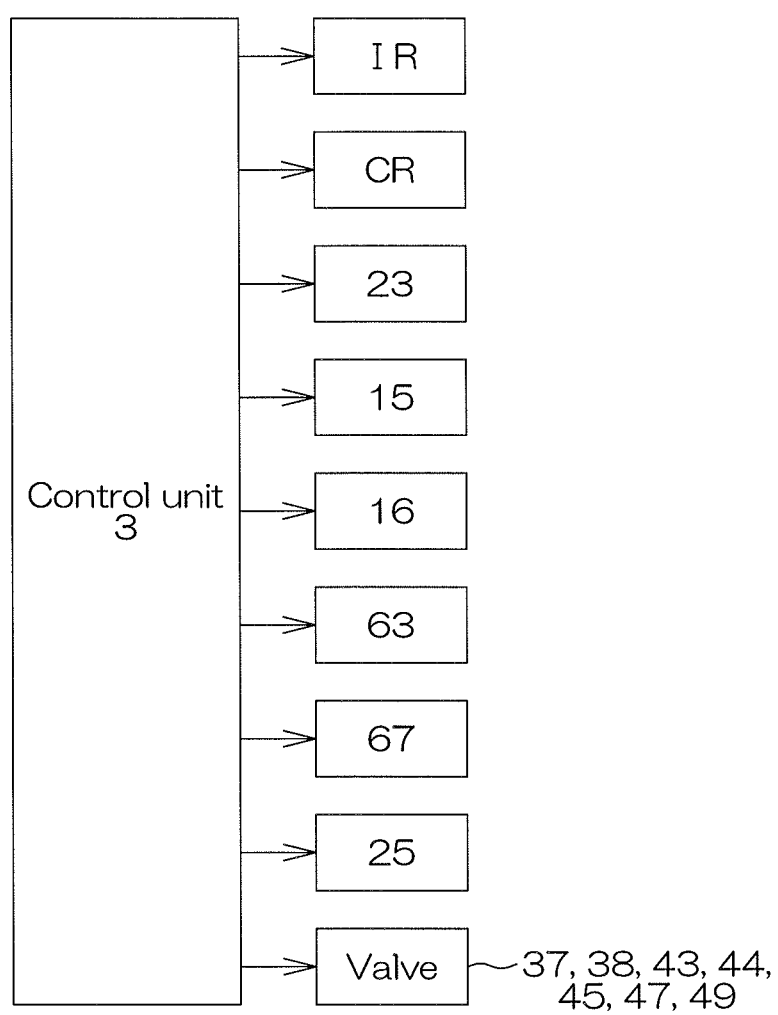
FIG. 6 is a block diagram which illustrates an electrical configuration of main portions in the substrate processing apparatus.

FIG. 6 is a block diagram which illustrates an electrical configuration of the main portions of the substrate processing apparatus 1. The control unit 3 is provided with a microcomputer and controls control targets included in the substrate processing apparatus 1 according to predetermined control programs. Specifically, the microcomputer is provided with a CPU (central processing unit) and a memory, and the CPU executes the control programs stored in the memory. The control unit 3 controls motions of the electric motor 23 for rotating and driving the transfer robots IR, CR and the spin chuck 5, the first nozzle moving unit 15, the second nozzle moving unit 16, the microwave oscillator 63, the power source 67, the chuck pin driving unit 25, valves 37, 38, 43, 44, 45, 47, and 49, etc.

FIG. 7 is a flowchart which illustrates an example of substrate processing by the substrate processing apparatus 1. An unprocessed substrate W is carried in the processing unit 2 from the carrier C by the transfer robots IR, CR and delivered to the spin chuck 5 (S1). Further, the control unit 3 controls the chuck pin driving unit 25 so that the chuck pin 20 can be made into the open state. In this state, the transfer robot CR delivers the substrate W to the spin chuck 5. The substrate W is placed on the supporting portion 52 (supporting surface 52a) of the chuck pin 20 in the open state. Thereafter, the control unit 3 controls the chuck pin driving unit 25 and makes the chuck pin 20 into the closed state. Thereby, the substrate W is gripped by the gripping portions 51 of the plurality of chuck pins 20.

Chemical liquid processing (S2) is started after the transfer robot CR has retracted outside the processing unit 2. The control unit 3 drives the electric motor 23 to rotate the spin base 21 at a predetermined chemical liquid rotating speed. On the other hand, the control unit 3 controls the second nozzle moving unit 16 to dispose the second moving nozzle 12 at a chemical liquid processing position above the substrate W. The chemical liquid processing position may be a position at which a chemical liquid which is discharged from the second moving nozzle 12 lands on the rotation center of the upper surface of the substrate W. Then, the control unit 3 opens the chemical liquid valve 43. Thereby, the chemical liquid is supplied from the second moving nozzle 12 toward the upper surface of the substrate W in a rotating state. The supplied chemical liquid spreads across the entire surface of the substrate W by a centrifugal force.

After chemical liquid processing of a fixed time, DIW rinse processing (S3) by replacing the chemical liquid on the substrate W with DIW to remove the chemical liquid from the substrate W is executed. Specifically, the control unit 3 closes the chemical liquid valve 43 and opens the DIW valve 47 instead. Thereby, the DIW from the DIW nozzle 10 is supplied toward the upper surface of the substrate W in the rotating state. The supplied DIW spreads across the entire surface of the substrate W by a centrifugal force. The chemical liquid on the substrate W is rinsed off by the DIW. During this process, the control unit 3 controls the second nozzle moving unit 16 to make the second moving nozzle 12 retract from above the substrate W to a side of the cup 8.

After DIW rinse processing of a fixed time, organic solvent processing (S4) by replacing the DIW on the substrate W with an organic solvent which is a processing liquid of lower surface tension (low surface tension liquid) is executed. The control unit 3 controls the first nozzle moving unit 15 to make the first moving nozzle 11 move to an organic solvent rinse position above the substrate W. The organic solvent rinse position may be a position at which the organic solvent (for example, IPA) discharged from an organic solvent nozzle 71 included in the first moving nozzle 11 lands on the upper surface at the rotation center of the substrate W. Then, the control unit 3 closes the DIW valve 47 and opens the organic solvent valve 37. Thereby, an organic solvent (liquid) is supplied from the first moving nozzle 11 (organic solvent nozzle 71) toward the upper surface of the substrate W in the rotating state. The supplied organic solvent spreads across the entire surface of the substrate W by a centrifugal force to replace the DIW on the substrate W.

When the DIW has been completely replaced with the organic solvent, the control unit 3 actuates the microwave oscillator 63. Microwaves generated from the microwave oscillator 63 are supplied via the coaxial cable 64 to the waveguide 62, by which the lower surface of the substrate W is irradiated. Thereby, the substrate W is heated. Further, the control unit 3 decelerates the rotation of the spin chuck 5 to stop the rotation of the substrate W or reduce the rotation (for example, less than 100 rpm) and also closes the organic solvent valve 37 to stop supply of the organic solvent. Thus, there develops a puddle state in which an organic solvent liquid film is supported on the substrate W in a stationary state. The substrate W is heated to partially evaporate the organic solvent in contact with the upper surface of the substrate W, by which a gas phase layer is formed between the organic solvent liquid film and the upper surface of the substrate W. Then, the organic solvent liquid film is kept in a state of floating above the substrate W.

In the organic solvent processing step S4, the organic solvent liquid film is heated via the substrate W. That is, the lower surface of the substrate W is irradiated with microwaves and the organic solvent liquid film is not directly irradiated. If the organic solvent liquid film is directly irradiated with microwaves, the organic solvent liquid film in its entirety is boiled, thus resulting in a failure of forming a gas phase layer between the organic solvent liquid film and the upper surface of the substrate W. In contrast, in the present preferred embodiment, the organic solvent liquid film is heated via the substrate Wand, therefore, a gas phase layer can be formed between the organic solvent liquid film and the upper surface of the substrate W. As a result, the organic solvent liquid film can be floated above the substrate W in a state of a liquid mass.

Next, the organic solvent liquid film is removed. In removing the organic solvent liquid film, the control unit 3 controls the first nozzle moving unit 15 to retract the first moving nozzle 11 to aside of the cup 8 from above the substrate W. Then, the control unit 3 controls the second nozzle moving unit 16 to dispose the second moving nozzle 12 at a gas discharge position above the substrate W. The gas discharge position may be a position at which an inert gas flow discharged from the second moving nozzle 12 is directed toward the rotation center of the upper surface of the substrate W. Then, the control unit 3 opens the inert gas valve 44 to discharge an inert gas toward the organic solvent liquid film on the substrate W. Thereby, at a position of receiving the discharged inert gas, that is, at the center of the substrate W, the organic solvent liquid film is removed by the inert gas, thus making a hole for exposing the upper surface of the substrate W at the center of the organic solvent liquid film. This hole is spread to remove the organic solvent on the substrate W outside the substrate W.

There is a possibility that during removal of the organic solvent liquid film from the substrate W, the organic solvent may drop on the heater unit 6. In the present preferred embodiment, the heater unit 6 is not heated up to a high temperature. Therefore, even if the organic solvent drops thereon, the organic solvent does not evaporate on the heater unit 6 and generate a great amount of mist. Accordingly, the atmosphere of substrate processing is not contaminated by mist of the organic solvent.

As described so far, after completion of the organic solvent processing, the control unit 3 closes the inert gas valve 44, retracts the second moving nozzle 12 and, thereafter, controls the electric motor 23 to rotate the substrate W at a high speed, that is, at a drying rotational speed. Thus, there is conducted drying processing (S5: spin-drying) in which liquid components on the substrate W are spun off by a centrifugal force.

Thereafter, the control unit 3 controls the electric motor 23 to stop rotation of the spin chuck 5. It also controls the microwave oscillator 63 to stop oscillation of microwaves. Further, the control unit 3 controls the chuck pin driving unit 25 to make the chuck pin 20 into an open position. Thereby, the substrate W is shifted from a state of being gripped by the gripping portion 51 of the chuck pin 20 to a state of being placed on the supporting portion 52. Thereafter, the transfer robot CR enters into the processing unit 2, scoops up the processed substrate W from the spin chuck 5 and carries it outside the processing unit 2 (S6). The substrate W is delivered from the transfer robot CR to the transfer robot IR and housed into the carrier C by the transfer robot IR.

Figure 8A:
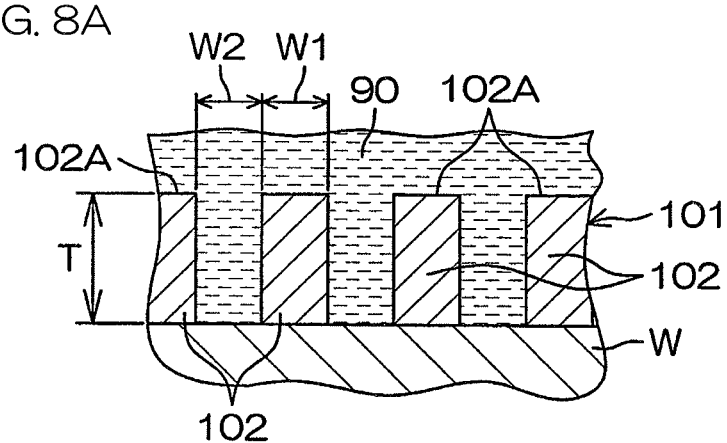
FIG. 8A and FIG. 8B are each an illustrative sectional view which illustrates formation of a gas phase layer on an upper surface of a substrate.
Figure 8B:
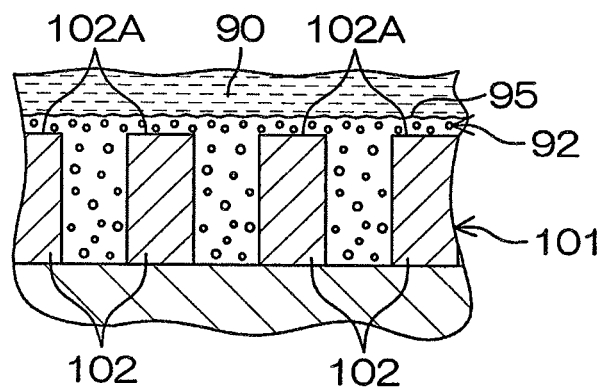

FIG. 8A and FIG. 8B are each an illustrative sectional view which illustrates the formation of the gas phase layer formed on the upper surface of the substrate W. A fine pattern 101 is formed on the surface of the substrate W. The pattern 101 includes fine projecting structures 102 formed on the surface of the substrate W. The structure 102 may include an insulator film or may include a conductor film. Also, the structure 102 may be laminated films formed by laminating a plurality of films. If line-shaped structures 102 are adjacent to each other, a groove (grooves) is formed therebetween. In this case, a width W1 of each structure 102 may be approximately 10 nm to 45 nm, and an interval W2 between structures 102 may be approximately 10 nm to several μm. A height T of each structure 102 may, for example, be approximately 50 nm to 5 μm. If a structure 102 is tubular, a hole is formed at the inner side thereof.

In an initial stage of the organic solvent processing step S4, as shown in FIG. 8A, an organic solvent liquid film 90 formed on the surface of the substrate W fills the interior of the pattern 101 (a space between adjacent structures 102 or an internal space of the tubular structure 102).

In a process during which the organic solvent liquid film floats up, the substrate W is heated and brought up to a temperature higher by a predetermined temperature (for example, 10 to 50° C.) than a boiling point of an organic solvent (82.4° C. in the case of IPA). The organic solvent in contact with the surface of the substrate W thus evaporates and generates a gas of the organic solvent, thereby forming a gas phase layer 92 as shown in FIG. 8B. The gas phase layer 92 fills the interior of the pattern 101 and further reaches the outside of the pattern 101 to form an interface 95 with the organic solvent liquid film 90 at a position higher than the upper surface 102A of the structure 102. The organic solvent liquid film 90 is supported on the interface 95. In this state, a liquid surface of the organic solvent is not in contact with the pattern 101 and, therefore, pattern collapse due to surface tension of the organic solvent liquid film 90 does not occur.

When the organic solvent evaporates due to an increase in temperature on the upper surface of the substrate, the organic solvent of the liquid phase is expelled instantaneously from insides the pattern 101. The organic solvent of the liquid phase is then supported on the formed gas phase layer 92 and separated from the pattern 101. The gas phase layer 92 of the organic solvent is thus interposed between the upper surface of the pattern 101 (the upper surface 102A of the structure 102) and the organic solvent liquid film 90 to support the organic solvent liquid film 90.

Figure 8C:
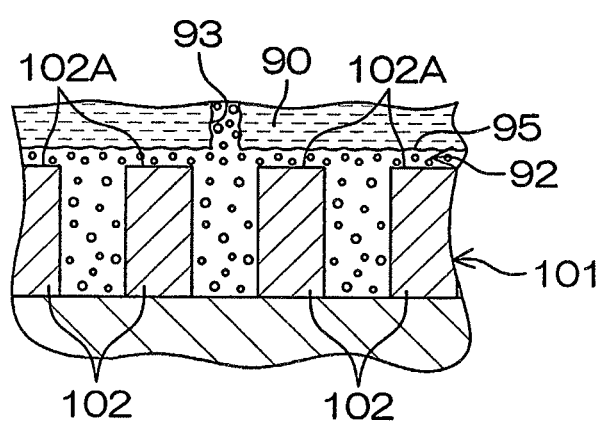
FIG. 8C is a sectional view which illustrates splitting of a liquid film.

As shown in FIG. 8C, when a crack or breakage 93 is formed in the organic solvent liquid film 90 that is floated from the upper surface of the substrate W, this becomes a cause of a defect such as watermark, etc., after drying. Therefore, in the present preferred embodiment, supply of the organic solvent is stopped after the rotation of the substrate W has been stopped so as to form a thick organic solvent liquid film 90 on the substrate W and avoid the formation of a breakage. In the organic solvent processing step S4, the substrate W is not rotated at a high speed (for example, 100 rpm) but the rotation of the substrate W is stopped or the substrate W is rotated at a low speed (for example, less than 100 rpm) so that the liquid film 90 will not split due to a centrifugal force. Therefore, the formation of a breakage in the liquid film 90 can be avoided. Further, the output of the microwave oscillator 63 and the power source 67 as well as heating time of the substrate are adjusted whenever necessary so that vapor of the organic solvent will not break and blow out through the liquid film 90, and the formation of a breakage is thereby avoided.

In a state that the organic solvent liquid film 90 is supported on the gas phase layer 92, a frictional resistance acting on the organic solvent liquid film 90 is small enough to be regarded as zero. The organic solvent liquid film 90 is thus easily moved when a force in a direction parallel to the upper surface of the substrate W is applied to the organic solvent liquid film 90. In the present preferred embodiment, an opening is formed in the center of the organic solvent liquid film 90 and a flow of the organic solvent is thereby caused by a temperature difference at the edge portion of the hole, thereby allowing the organic solvent liquid film 90 supported on the gas phase layer 92 to move for removal.

Figure 10:
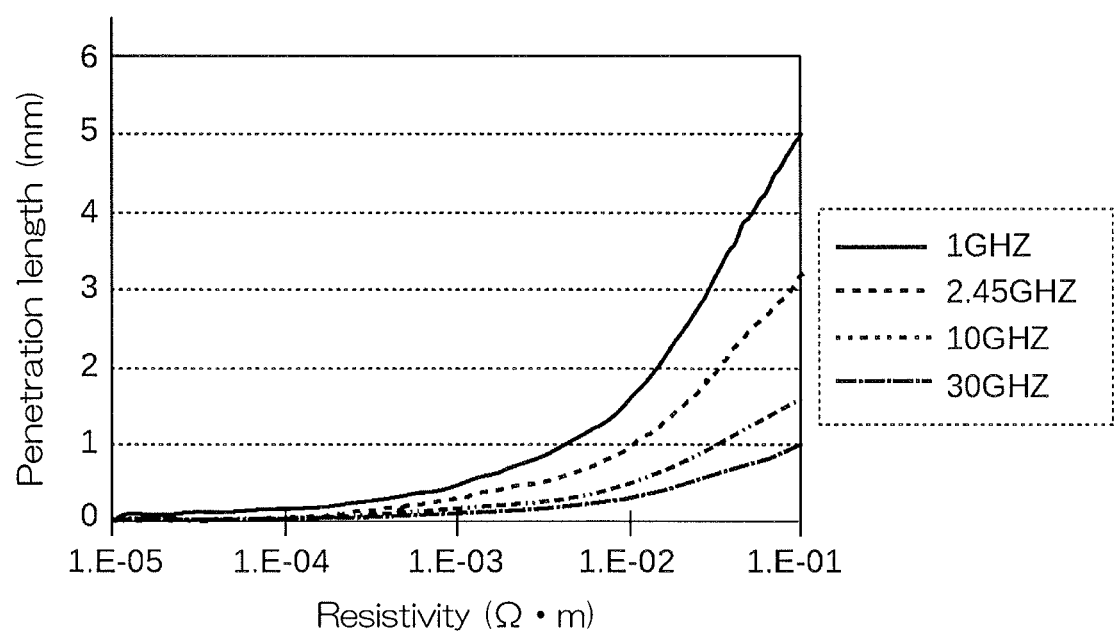
FIG. 10 is a graph showing a penetration length of microwaves into a substrate with respect to a frequency of microwaves.

In the present preferred embodiment, not only the waveguide 62 but also the light source 66 is embedded in the heater main body 60. Hereinafter, a description will be given of reasons for embedding the light source 66 therein. FIG. 10 is a graph showing the penetration length of microwaves into a substrate with respect to the frequency of microwaves. In a case where a substrate is high in resistivity as shown in the graph, microwaves will travel through the substrate, unless the substrate is irradiated with high-frequency microwaves (for example, about 30 GHZ). In this case, the substrate is not sufficiently heated. Further, the high frequency microwaves (for example, about 30 GHZ) will cause a great transmission loss inside the coaxial cable 64.

In order to lower the resistivity of the substrate W by photoelectric effects, the light source 66 irradiates the substrate W with visible light and near-infrared light. Where the substrate W is lowered in resistivity (for example, lowered to $1.0 \times 10^{-1}$ to $1.0 \times 10^{-3}$ Ω·m), the substrate W is raised in absorption rate of microwaves and can be easily heated even where low frequency microwaves (for example, about 1 GHZ) are used. Thus, where a substrate W is high in resistivity, the substrate W is irradiated with visible light and near-infrared light from the light source 66 to lower the resistivity of the substrate W so that the substrate W can be improved in absorption rate of microwaves.

Although a preferred embodiment of the present invention has been described above, the present invention may be implemented in yet other modes. Several modes included within the scope of the present invention shall be described below as examples.

1. Methanol, ethanol, acetone and HEF (hydrofluoroether) can be cited as examples of an organic solvent other than IPA that may be used. All of these are organic solvents that are lower in surface tension than water (DIW). The present invention is also applicable to a processing liquid other than an organic solvent. For example, the present invention may be applied to remove a rinse liquid such as water, etc., off a substrate. Carbonated water, electrolyzed ion water, ozone water, aqueous hydrochloric acid solution of diluted concentration (of, for example, approximately 10 to 100 ppm) or reduced water (hydrogen water), etc., can be cited as examples of a rinse liquid other than water.

2. In the hole opening step, another inert gas such as cleaned air, etc., may be employed besides nitrogen gas.

Figure 9:
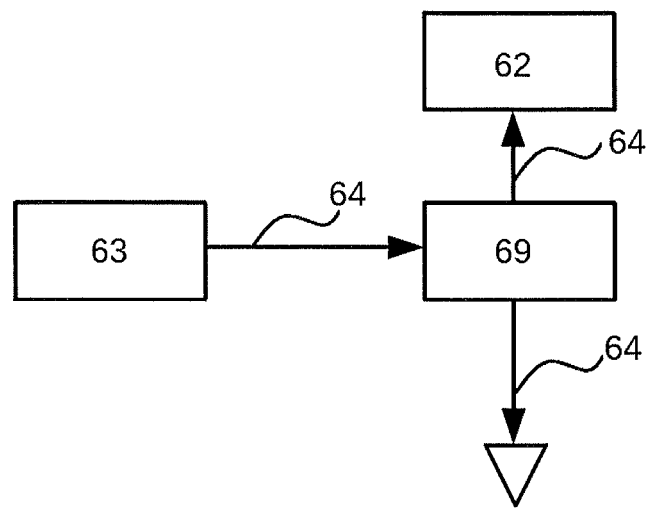
FIG. 9 is a schematic view which illustrates a coaxial switching unit 69 for selectively outputting microwaves to a waveguide 62 and the grounding wire.

3. Where there is used the microwave oscillator 63 having a longer period of time from power activation to the start of oscillation of microwaves, as shown in FIG. 9, the coaxial switching unit 69 may be interposed in the coaxial cable 64 between the microwave oscillator 63 and the waveguide 62, thereby selectively outputting microwaves from the microwave oscillator 63 to the waveguide 62 and a grounding wire.

In this case, the control unit 3 controls the coaxial switching unit 69 so that the microwave oscillator 63 is constantly kept turned on, microwaves are output to the waveguide 62 at a time when heating of the substrate W is started (for example, at the time of starting the above-described organic solvent processing step S4) and microwaves are output to a grounding wire at a time other than the above-described time.

4. In the above-described preferred embodiment, the upper surface 60a of the heater main body 60 is separated from the lower surface of the substrate W. Therefore, mist, etc., generated at the time of the chemical liquid processing step S2 may enter into a region between the upper surface 60a thereof and the lower surface of the substrate W. In this case, mist may absorb microwaves irradiated from the waveguide 62 to lower a heating efficiency. Thus, when the heater unit 6 is actuated (for example, at the time of organic solvent processing step S4), nitrogen gas may be generated from the discharge port 9a at the center of the heater unit 6, etc., to fill with nitrogen gas the atmosphere between the lower surface of the substrate W and the heater main body 60, thereby suppressing or preventing mist, etc., from entering therein from outside.

5. In the above-described preferred embodiment, the substrate W is heated by being irradiated with microwaves at the time of the organic solvent processing step. The substrate W may be irradiated with microwaves in a step other than this step. The substrate W may be irradiated with microwaves, for example, when a step is executed by using a processing liquid other than an organic solvent (for example, a chemical liquid or DIW) or when drying processing is executed.

6. In the above-described preferred embodiment, the substrate W is heated in a state that the heater unit 6 is not rotated. However, the heater unit 6 may be rotated when the substrate is heated. It is desirable that the heater unit 6 is rotated in the same direction as that of the substrate W and also rotated at the same or approximately the same speed as that of the substrate W.

7. In the above-described preferred embodiment, the substrate W is heated by using the heater unit 6 when a processing liquid is supplied toward the upper surface of the substrate W. However, the present invention is also applicable to a case where the substrate W is heated by using the heater unit 6 when a processing liquid is supplied toward the lower surface of the substrate W. The substrate W may be heated, for example, when a processing liquid such as a rinse liquid, etc., is supplied from the lower surface nozzle 9 toward the lower surface of the substrate W.

While preferred embodiments of the present invention have been described in detail above, these are merely specific examples used to clarify the technical contents of the present invention, and the present invention should not be interpreted as being limited only to these specific examples, and the scope of the present invention shall be limited only by the appended claims.

The present application corresponds to Japanese Patent Application No. 2016-67177 filed in the Japan Patent Office on Mar. 30, 2016, and the entire disclosure of this application is incorporated herein by reference.

REFERENCE SIGNS LIST

W: Substrate
1: Substrate processing apparatus

2: Processing unit
3: Control unit
5: Spin chuck
6: Heater unit
8: Cup
9: Lower surface nozzle
9a: Discharge port
10: DIW nozzle
11: First moving nozzle
12: Second moving nozzle
13: Chamber
15: First nozzle moving unit
16: Second nozzle moving unit
20: Chuck pin
21: Spin base
22: Rotating shaft
23: Electric motor
24: Through hole
25: Chuck pin driving unit
26: Link mechanism
27: Driving source
30: Support shaft
35: Organic solvent supply pipe
37: Organic solvent valve
38: Inert gas valve
41: Chemical liquid supply pipe
42: Inert gas supply pipe
44: Inert gas valve
45: Variable flow valve
46: DIW supply pipe
47: DIW valve
48: Fluid supply pipe
49: Fluid valve
60: Heater main body
62: Waveguide
63: Microwave oscillator
67: Coaxial cable
65: Protective member
66: Light source
67: Power source
68: Power cable
69: Coaxial switching unit

What is claimed is:

1. A substrate processing apparatus, comprising:
a spin base on which a chuck member that holds a substrate is disposed;
a motor which rotates the spin base;
a heater which is positioned between the substrate held by the chuck member and an upper surface of the spin base;
a processing liquid supply nozzle which supplies a processing liquid toward a surface of the substrate held by the chuck member; and
a microwave generator which generates microwaves toward a lower surface of the substrate from the heater, the microwave generator including a microwave generating member which includes a waveguide disposed in the heater, a microwave oscillator disposed outside the heater, and a coaxial cable which connects the waveguide to the microwave oscillator.

2. The substrate processing apparatus according to claim 1, wherein an upper surface of the waveguide is protected by a protective member.

3. The substrate processing apparatus according to claim 1, wherein the processing liquid is an organic solvent which is supplied to an upper surface of the substrate, and the heater heats the substrate when the substrate is processed by the organic solvent.

4. The substrate processing apparatus according to claim 3, wherein the processing liquid supply nozzle supplies the organic solvent so as to form a liquid film of the organic solvent on the upper surface of the substrate, the heater heats the substrate at least when the liquid film of the organic solvent has been formed, so that a gas film layer is formed between a liquid film of the organic solvent and the upper surface of the substrate, thereby causing the liquid film of the organic solvent to float from the upper surface of the substrate.

5. The substrate processing apparatus according to claim 1, further comprising a light source that irradiates, to the substrate, a light for lowering a resistivity of the substrate by photoelectric effects.

6. The substrate processing apparatus according to claim 1, wherein the processing liquid supply nozzle supplies the processing liquid so as to form a liquid film of the processing liquid on the upper surface of the substrate,
the microwave generator generates the microwave toward the lower surface of the substrate so that a gas film layer is formed between the liquid film of the processing liquid and the upper surface of the substrate, thereby causing the liquid film of the processing liquid to float from the upper surface of the substrate in a state of a liquid mass, and
the substrate processing apparatus further comprises a liquid film remover that makes a hole in the liquid film floated by the gas film layer in the state of the liquid mass, and spreads the hole, so as to remove the liquid film of the processing liquid in the state of the liquid mass outside the substrate.

7. The substrate processing apparatus according to claim 6, wherein the liquid film remover includes an inert gas nozzle that discharges an inert gas toward the liquid film floated by the gas film layer in the state of the liquid mass.

8. The substrate processing apparatus according to claim 6, wherein the processing liquid is an organic solvent.

9. A substrate processing method, comprising the steps of:
holding a substrate with a chuck member disposed on a spin base;
rotating the spin base with a motor;
heating the substrate with a heater which is positioned between the substrate held by the chuck member and an upper surface of the spin base; and
supplying a processing liquid toward a surface of the substrate held by the chuck member; wherein
the heating step includes a step of generating microwaves, with a microwave generator, toward a lower surface of the substrate from the heater, the microwave generator including a microwave generating member which includes a waveguide disposed in the heater, a microwave oscillator disposed outside the heater, and a coaxial cable which connects the waveguide to the microwave oscillator.

10. The substrate processing method according to claim 9, wherein an upper surface of the waveguide is protected by a protective member.

11. The substrate processing method according to claim 9, wherein the processing liquid is an organic solvent which is supplied to an upper surface of the substrate, and the heating step heats the substrate, with the heater, when the substrate is processed by the organic solvent.

12. The substrate processing method according to claim 11, wherein the processing liquid supply step includes a step of forming a liquid film of the organic solvent on the upper surface of the substrate, and the heating step heats the substrate, with the heater, at least when the liquid film of the organic solvent has been formed, so that a gas film layer is formed between a liquid film of the organic solvent and the upper surface of the substrate, thereby causing the liquid film of the organic solvent to float from the upper surface of the substrate.

13. The substrate processing method according to claim 9, further comprising the step of irradiating, to the substrate, a light for lowering a resistivity of the substrate by photoelectric effects.

14. The substrate processing method according to claim 9, wherein the processing liquid supplying step supplies the processing liquid so as to form a liquid film of the processing liquid on the upper surface of the substrate, the microwave generating step generates the microwave toward the lower surface of the substrate so that a gas film layer is formed between the liquid film of the processing liquid and the upper surface of the substrate, thereby causing the liquid film of the processing liquid to float from the upper surface of the substrate in a state of a liquid mass, and the substrate processing method further comprises the step of removing the liquid film of the processing liquid in the state of the liquid mass outside the substrate, the liquid film removing step including the step of making a hole in the liquid film floated by the gas film layer in the state of the liquid mass, and the step of spreading the hole.

15. The substrate processing method according to claim 14, wherein the liquid film removing step includes the step of discharging an inert gas toward the liquid film floated by the gas film layer in the state of the liquid mass.

16. The substrate processing method according to claim 14, wherein the processing liquid is an organic solvent.

* * * * *